(12) United States Patent
Hyobu (10) Patent No.: US 6,491,177 B1
(45) Date of Patent: Dec. 10, 2002

(54) THIN-PLATE ACCOMMODATING/TRANSPORTING CONTAINER

(75) Inventor: Yukihiro Hyobu, Tokyo (JP)

(73) Assignee: Kakizaki Manufacturing Co., Ltd. (JP)

( * ) Notice: Subject to any disclaimer, the term of this patent is extended or adjusted under 35 U.S.C. 154(b) by 0 days.

(21) Appl. No.: 09/536,780

(22) Filed: Mar. 28, 2000

(30) Foreign Application Priority Data

Apr. 6, 1999 (JP) ............................................. 11-098420

(51) Int. Cl.⁷ ............................................. B65D 53/00
(52) U.S. Cl. .................. 220/4.01; 220/230; 220/367.1; 206/454; 206/711
(58) Field of Search ............................... 220/4.01, 230, 220/324, 367.1; 206/711, 454, 832

(56) References Cited

U.S. PATENT DOCUMENTS

| | | | | |
|---|---|---|---|---|
| 4,110,552 A | * | 8/1978 | Lombardi ................ | 220/230 X |
| 4,817,799 A | * | 4/1989 | Gregerson et al. ....... | 206/711 X |
| 5,873,468 A | * | 2/1999 | Ejima et al. ............ | 206/454 X |
| 5,944,211 A | * | 8/1999 | Woodnorth et al. ... | 220/367.1 X |
| 6,170,690 B1 | * | 1/2001 | Hosoi ..................... | 206/454 X |

FOREIGN PATENT DOCUMENTS

| | | |
|---|---|---|
| JP | 4728405 | 3/1946 |
| JP | 220042 | 1/1990 |
| JP | 4303941 | 10/1992 |
| JP | 62699 | 1/1994 |
| JP | 7307380 | 11/1995 |
| JP | 964161 | 3/1997 |
| JP | 9107026 | 4/1997 |
| JP | 9139421 | 5/1997 |
| JP | 9301401 | 11/1997 |
| JP | 1056050 | 2/1998 |

* cited by examiner

Primary Examiner—Steven Pollard
(74) Attorney, Agent, or Firm—Lorusso & Loud (57) ABSTRACT

Disclosed is a thin-plate accommodating/transporting container including a container body for accomodating and supporting a plurality of thin plates while keeping the interior of the container clean, comprising:

positioning means, provided at the container body, for accurately adjusting a placement position of the container body;

lid receiving portion which is provided in the container body and to which the lid is attached; and engagement means, provided at the lid receiving portion, for engaging with various types of lids of different attachment methods.

7 Claims, 7 Drawing Sheets

THIN-PLATE ACCOMMODATING/TRANSPORTING CONTAINER

BACKGROUND OF THE INVENTION

1. Field of the Invention

The present invention relates to a thin-plate accommodating/transporting container in which one type of a container body can be combined with various types of lids, and can be used according to processing stages, such as transportation, process, storage, or the like, and according to uses.

2. Description of Conventional Art

As a commonly known example of a thin-plate accommodating/transporting container, a container which accommodates and transports semiconductor silicon wafers can be mentioned. In such a wafer accommodating/transporting container, when the container is transported, it is important to keep the interior of the container clean so as to prevent the surfaces of the wafers from being contaminated. In order to keep the interior of the container clean, the container is sealed. Sealing of the container is conducted by firmly securing the lid to the container body.

Examples of means for sealing the container include a combination of an engaging claw and an engagement hole, a structure employing a magnet, a structure utilizing a negative pressure (the term "negative pressure" as used herein refers to a pressure lower than the atmospheric pressure.). According to types of sealing means employed, the container body and lid are provided with a combination of an engaging claw and an engagement hole, a magnet, a sealing member, or the like.

At a wafer maker, semiconductor silicon wafers are accommodated in the thin-plate accommodating/transporting container, and then the container is sealed by such sealing means. Thereafter, the container is transported to a semiconductor manufacturing factory of a device maker (hereinafter, a container used for transportation will be occasionally referred to as "carriage container"). In the manufacturing factory, at the vicinity of the production line, the semiconductor wafers are transferred from the carriage container to an IC pattern-forming-step container and/or a storage container according to uses, and then such production line containers are placed on the production line. Here, the term "IC pattern-forming-step container" refers to a container used at the step of forming IC (integrated circuit) patterns, and the term "storage container" refers to a container used for storing wafers in the course of the manufacturing steps. The term "production line container" is a generic term of the IC pattern-forming-step container and the storage container because the IC pattern-forming-step container and the storage container are both used at the production line.

Each of the above-mentioned types of containers has a function suitable for each use. More particularly, in the case of the carriage container, emphasis is placed on sealing property in order to prevent contamination caused by invasion of foreign matters or the like because the carriage container is transported via an automobile or an airplane. In the cases of the IC pattern-forming-step container and the storage container, emphasis is placed on operability or usability at the time of opening or closing the lid rather than sealing property because the IC-pattern-forming-step container and storage container are used in the clean room.

Meanwhile, after the semiconductor silicon wafer is transferred from the thin-plate accommodating/transporting container used for transportation (i.e. carriage container) to the production line containers, the thin-plate accomodating/transporting container used for transportation becomes unnecessary, so that the thin-plate accomodating/transporting container used for transportation is treated as disposal waste. Thus, in conventional art, the thin-plate accommodating/transporting container is used only for transportation. This causes unfavorable problems of lower use efficiency of the container, waste of resources, increase of disposal waste, and high manufacturing costs.

SUMMARY OF THE INVENTION

The present-invention has been accomplished in view of the above-mentioned problems. An object of the present invention is to provide a thin-plate accommodating/transporting container which, after being used for transportation, can be also used for the processes conducted at the production line.

To achieve the above object, according to a first aspect of the present invention, there is provided a thin-plate accommodating/transporting container including a container body for accommodating and supporting a plurality of thin plates while keeping the interior of the container clean, comprising:

positioning means, provided at the container body, for accurately adjusting a placement position of the container body;

lid receiving portion which is provided in the container body and to which the lid is attached; and     engagement means, provided at the lid receiving portion, for engaging with various types of lids of different attachment methods.

Owing to this constitution, thin plates, such as semiconductor wafers, are accommodated in a container body, and a lid which is used for transportation (hereinafter, occasionally referred to as "transportation-use lid") is attached on the container body, and then the container is transported to a semiconductor manufacturing factory or the like while keeping the interior of the container clean. Thereafter, the transportation-use lid is removed, and instead a lid used for a production line or the like in the factory is attached to the container body. Attachment of the lid to the container body is conducted by means of engaging means. The container body can be used as it is at the production line or for storage in the factory because positioning means provided in the container body is standardized. Placement of the container is conducted in such a manner that the container is accurately positioned at a specific location by means of the positioning means, and then placed at the specific location. Thus, the container body of the thin-plate accommodating/transporting container can be used for production line or the like after it is used for transportation. Accordingly, use efficiency is greatly enhanced, and manufacturing costs can be reduced.

According to a second aspect of the present invention, in the thin-plate accommodating/transporting container according to the first aspect of the present invention, the engagement means provided at the container body includes at least two means out of hooking, adsorption, and vacuum attraction which serve as means for engaging the lid with the container body.

Owing to this constitution, by means of engaging means, a plurality of lids of different attachment methods can be attached to the container body. Accordingly, the container body, which has been used for transporting thin plates, can be used at the production line or the like as it is, so that use efficiency is greatly enhanced, and manufacturing costs can be reduced.

According to a third aspect of the present invention, in the thin-plate accommodating/transporting container according to the first aspect of the present invention, the engagement means provided at the container body includes: an engagement claw or engagement hole which engages with an engagement hole or engagement claw provided in a first-type lid; a magnetic member or magnet which attracts a magnet or magnetic member provided in a second-type lid; and a sealing member attaching portion or sealing member which comes in contact with a sealing member or sealing member receiving portion provided in a third-type lid to seal the container so as to maintain the air pressure of the interior of the container subjected to vacuum attraction treatment to a negative pressure (The term "vacuum attraction treatment" as used herein refers to treatment in which the air pressure of the interior of the container is lowered to a negative pressure by absorbing the air in the interior of the container so that the lid can be attracted downward by the outer force caused by negative pressure).

Owing to this constitution, when the first-type lid provided with the engagement claw or engagement hole is attached to the lid receiving portion formed in the container body, the engagement claw or engagement hole in the first-type lid engages with the engagement claw or engagement hole of the container body, whereby the lid is attached to the container body.

When the second-type lid provided with a magnet or magnetic member is attached to the lid receiving portion, the magnet or magnetic member provided in the second-type lid is attracted to the magnetic member or magnet provided in the container body, whereby the lid is attached to the container body. It should be noted that, in the pair of the magnet or magnetic member provided in the lid and the magnet or magnetic member provided in the container body, at least one of the elements constituting the pair must be a magnet. This is because, if both elements constituting the pair are magnetic members, they do not attract each other.

When the third-type lid provided with a sealing member or sealing member receiving portion is attached to the lid receiving portion formed in the container body, the sealing member or sealing member receiving portion provided at the third-type lid comes into contact with the sealing member receiving portion or sealing member provided in the container body, whereby the lid and container body are sealed. The interior of the container body is subjected to vacuum attraction treatment so as to keep the air pressure of the interior of the container body to a negative pressure, whereby the lid is pressed toward the container body by the force of the atmospheric pressure.

BRIEF DESCRIPTION OF THE DRAWINGS

Other features, objects and advantages of the present invention will become apparent from the following description of the preferred embodiments with reference to the drawings in which like reference characters designate like or corresponding parts throughout several views, and in which.

DETAILED DESCRIPTION OF THE INVENTION

Hereinafter, the present invention will be described by way of an embodiment with reference to the attached drawings.

The following descriptions of the thin-plate accommodating/transporting container according to the present invention will be made by employing, as an example, a semiconductor silicon wafer accommodating/transporting container which accommodates and transports semiconductor silicon wafers as thin plates.

Figure 2:
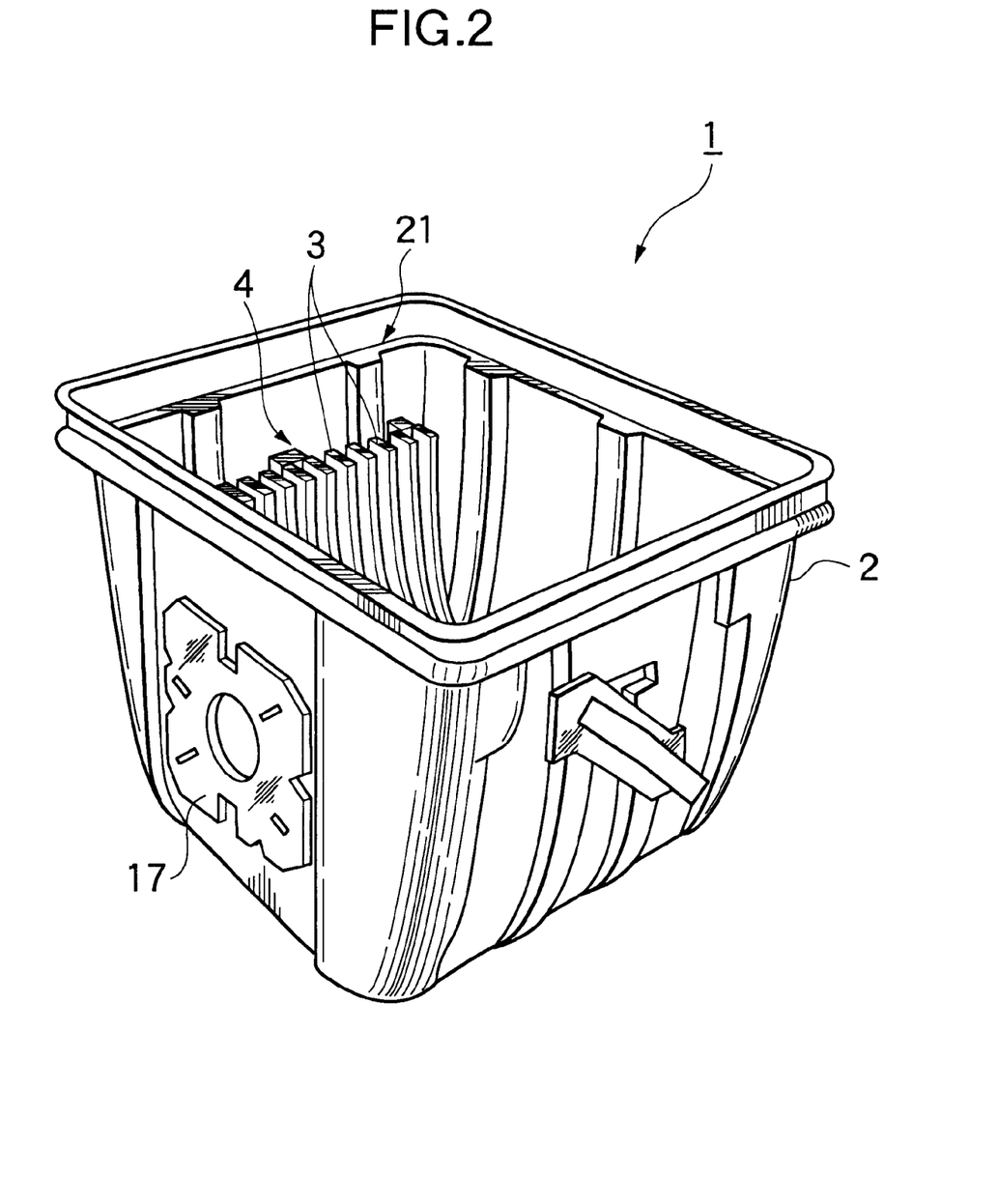
FIG. 2 is a perspective view showing a semiconductor silicon wafer accommodating/transporting container according to the present invention.
Figure 3:
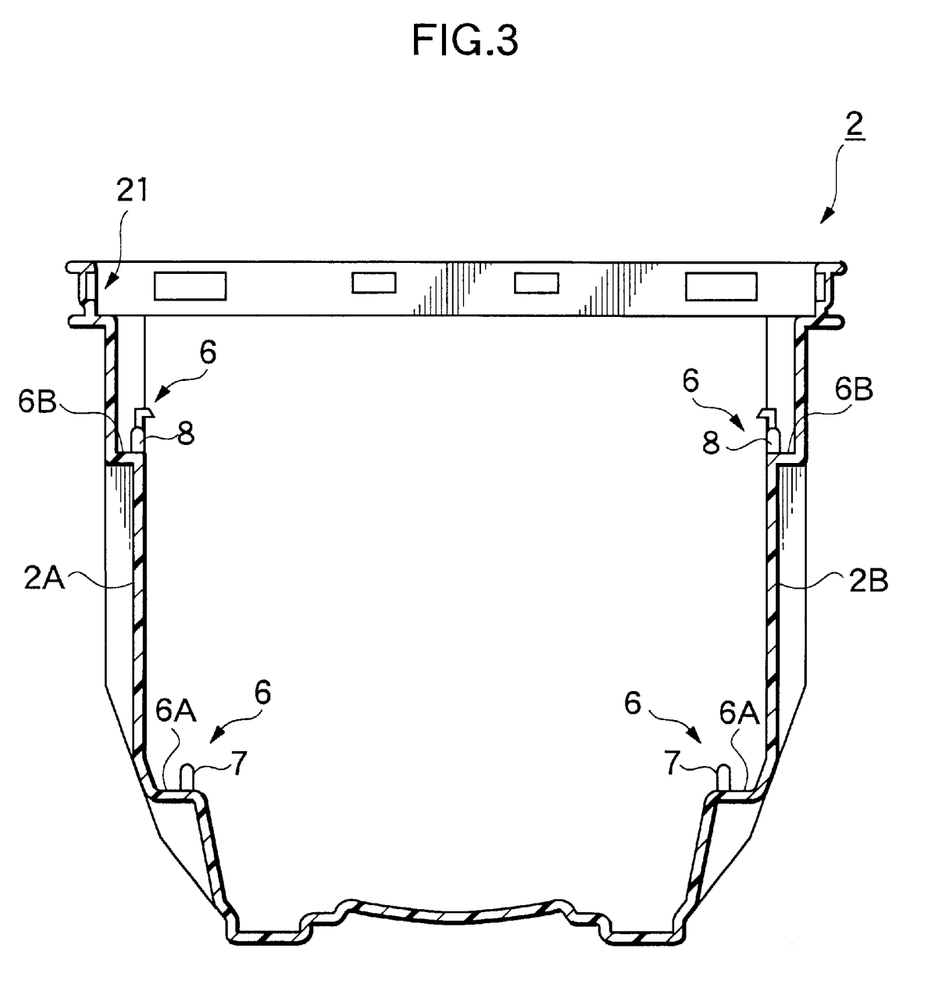
FIG. 3 is a sectional view of the semiconductor silicon wafer accommodating/transporting container shown in FIG. 2.

Referring to FIGS. 2 and 3, the semiconductor silicon wafer accommodating/transporting container 1 according to the present embodiment includes: a container body 2 for accomodating therein a plurality of semiconductor silicon wafers (not shown); plate-shaped units 4 each of which is provided on each of the opposing side walls of the container body and has ribs 3 for supporting the semiconductor wafers in the container body 2 from the both sides of the wafers in such a manner that the wafers are spaced from the neighboring one by a predetermined distance; and a lid (See FIGS. 7, 8, 9 and 10) for covering and sealing the open top or the container body 2 so as to keep the interior of the container body 2 clean.

The container body is formed in the shape of a substantial cube as a whole. The inside surface of each of the side walls 2A and 2B of the container body 2 is provided with supporting terraces 6 each of which is detachably mounted and adapted to support the plate-shaped member 4. Each supporting terrace 6 includes a lower terrace 6A and an upper terrace 6B. Each lower terrace 6A is formed with a lower portion supporting protrusion 7. Each upper terrace 6B is formed with an upper portion supporting protrusion 8.

Figure 4:
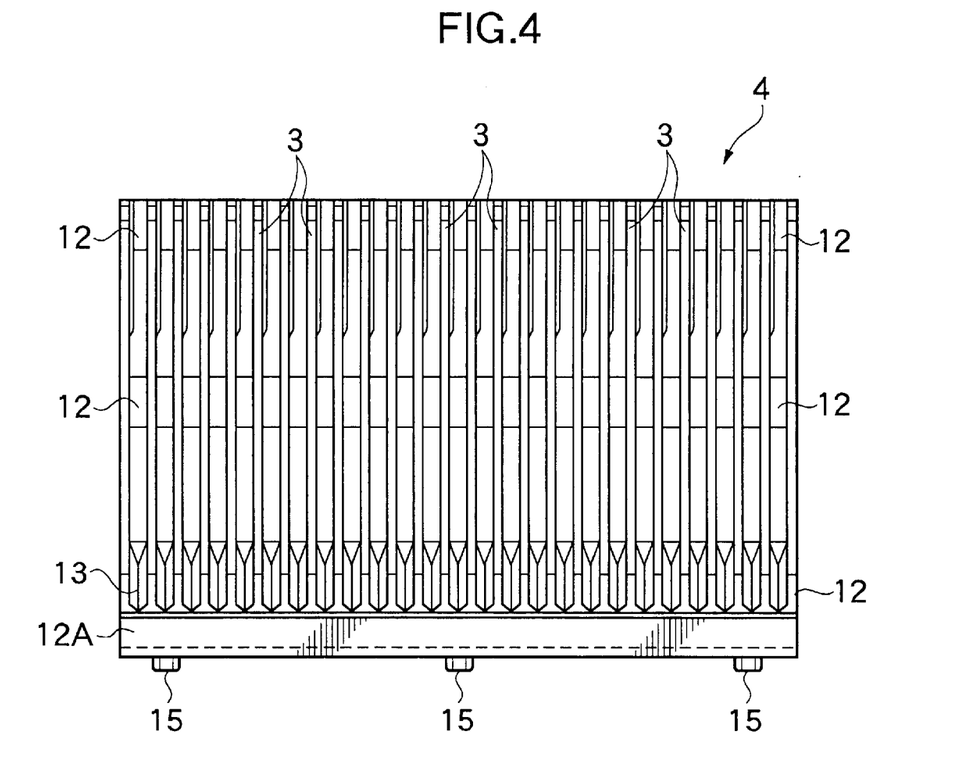
FIG. 4 is an elevational view showing a plate-shaped member used in the semiconductor silicon wafer accommodating/transporting container shown in FIG. 2.
Figure 5:
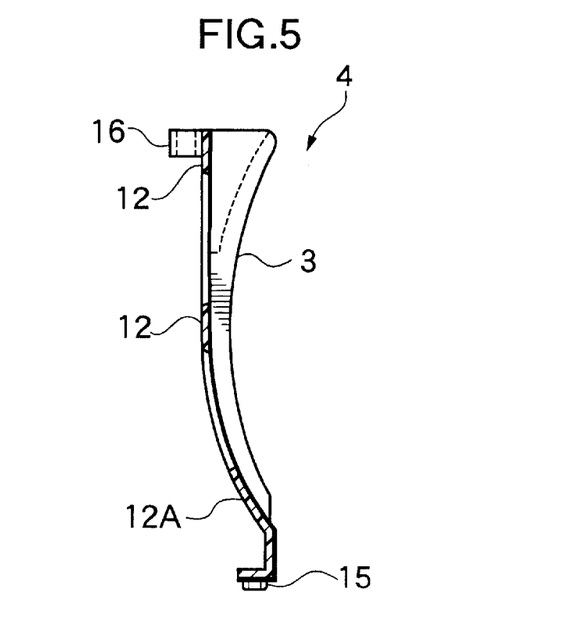
FIG. 5 is a side view showing a plate-shaped member used for the semiconductor silicon accommodating/transporting container shown in FIG. 2.

The plate-shaped unit 4 is detachably mounted on the supporting terrace 6 in the container body 2. The concrete construction of the plate-shaped unit 4 is shown in FIGS. 4 and 5. The plate-shaped unit 4 is generally includes: a plurality of ribs 3 which are arranged in parallel at a predetermined spacing and adapted to support the semiconductor wafers in such a manner that the individual wafers are spaced apart from each other; three supporting bars 12 which are integrally connected to and thereby support the plurality of ribs 3 thus arranged at three positions of each rib; and V-shaped groove 38 formed on the inner surface (surface which contacts with the semiconductor wafers) of the supporting bar 12A, which is situated at the innermost position of all the supporting bars.

On the rear surface of the thin-plate supporting unit 3, there are provided three lower portion supporting holes 15 which engage with their corresponding lower portion supporting protrusions 7 provided on the supporting terrace 6 so as to support the lower portion of the plate-shaped unit 4, and upper portion supporting holes 16 which engage with their corresponding upper portion supporting protrusions 24 so as to support the upper portion of the plate-shaped unit 4.

Figure 6:
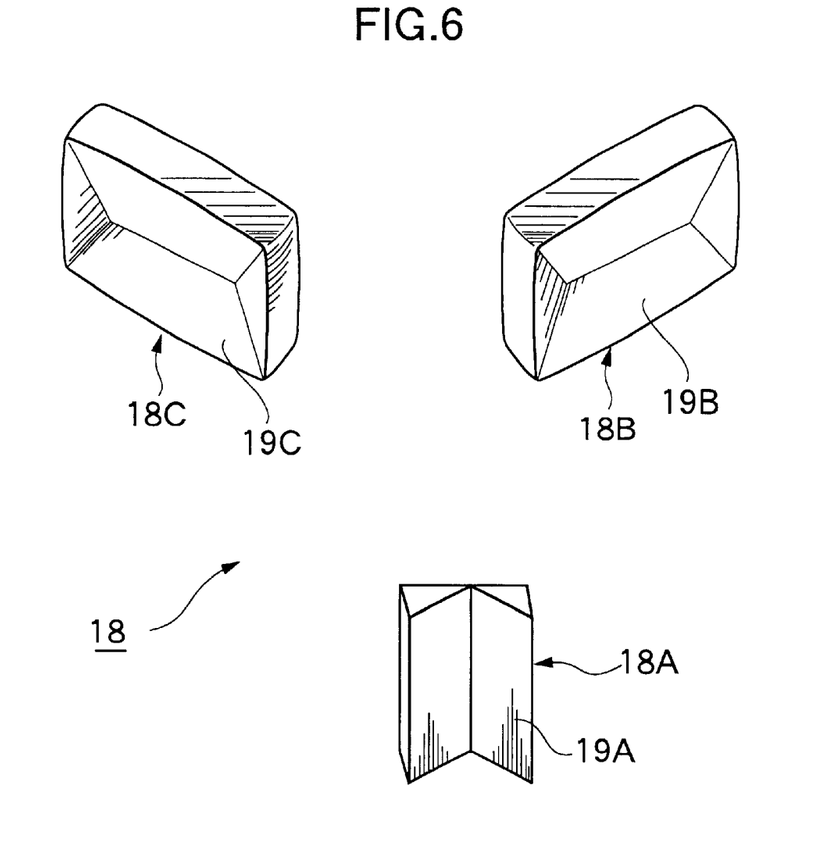
FIG. 6 is an elevational view showing a positioning engagement portion.

As shown in FIG. 2, at one of the end walls of the container body 2, there are provided carrying flange portion 17 which is gripped by the arm of transfer equipment (not shown) provided at a production line or the like. As shown in FIG. 6, at the other end wall of the container body 2, there is provided a positioning engagement unit 18 which serves as positioning means for accurately positioning the placement position of the container body 2. The positioning engagement unit 18 includes three engaging tips 18A, 18B and 18C. The engagement tips 18A, 18B and 18C have V-shaped engagement groove 19A, 19B and 19C, respectively. The V-shaped grooves 19A, 19B and 19C are arranged in such a manner that the grooves 19A, 19B and 19C direct in three respective directions in which each pair of neighboring directions forms a substantially 120-degree angle. The dimensions, angles and the like of the positioning engagement unit 18 are standardized. In the place where the container body 2 is placed, engagement protrusions (not shown) are provided at three locations corresponding to the engagement tips 18A, 18B and 18C and adapted to engage with the V-shaped grooves 19A, 19B and 19C, respectively, whereby the container body 2 is accurately positioned.

At each of the side walls, there is provided a handle which is gripped by the operator when the container body 2 is lifted so as to be placed in a vertical position or in a horizontal position. The handle is constructed as a rod-shaped member which extends in an oblique direction. Alternatively, the handle may be constructed as a thick disk-shaped member.

Figure 1:
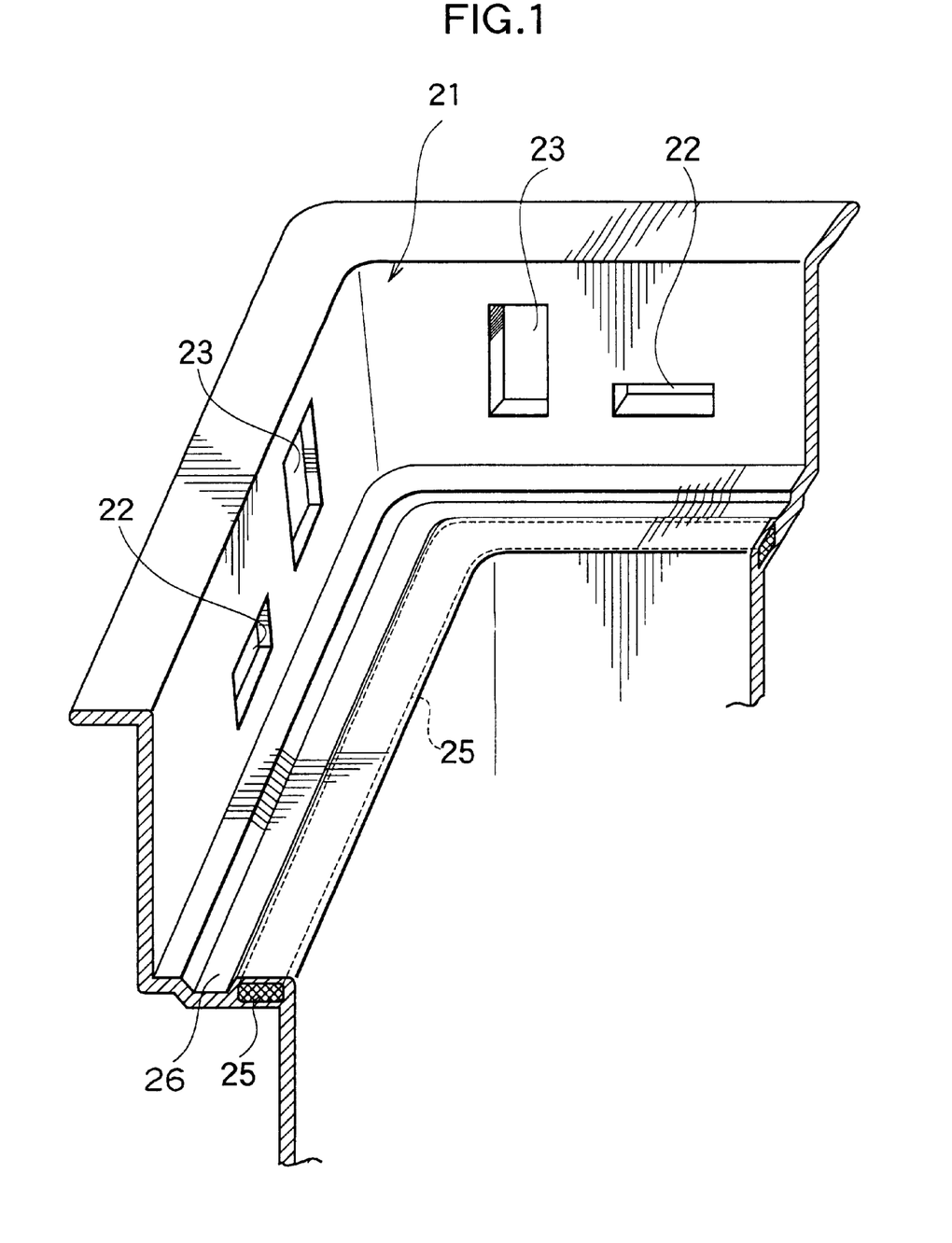
FIG. 1 is a main-portion perspective view showing a lid receiving portion of a semiconductor silicon wafer accommodating/transporting container according to the present invention.

In the upper portion of the container body 2, there is formed a lid receiving portion 21 adapted to receive the lid. The lid receiving portion 21 is formed by broadening the upper edge portion of the container body 2 up to such a dimension as to receive the lid.

At the lid receiving portion 21, there is formed a first-engagement-claw engagement holes 22 with which first engagement claws 32 of the first-type lid (which will be described later) engage. At each of the four corners of the lid receiving portion 21, a pair of first-engagement-claw engagement holes 22 are formed. Further, at the inside areas of the pair of first-engagement-claw engagement holes 22 (namely, the areas closer to a corner of the lid receiving portion 21), there are formed a pair of second-engagement-claw engagement holes 23 (which will be described later) with which the second engagement claws 35 engage.

Further, the lid receiving portion 21 is formed by broadening to such an extent that the lid receiving portion 21 copes with various shapes of lid. More particularly, the shape and dimensions of the lower circumferential portion of the lid which contacts with the lid receiving portion 21 differ according to the types of the lid. In order to cope with such various shapes and dimensions, it is necessary to make the lid receiving portion 21 sufficiently broad.

At the lid receiving portion 21, a magnet 25 is embedded along the entire circumference of the lid receiving portion 21. Owing to this constitution, the container body can cope with both of the cases where the magnet provided in the lid is embedded in a continuous manner and where the magnet is provided in the lid is embedded in a discontinuous manner. The magnet 25 may be embedded in such a broader manner as to contain the sealing groove 26 and the areas sandwiching the sealing groove 26. This constitution allows the lid receiving portion 21 to cope with various types of magnets embedded in different manners.

Figure 7:
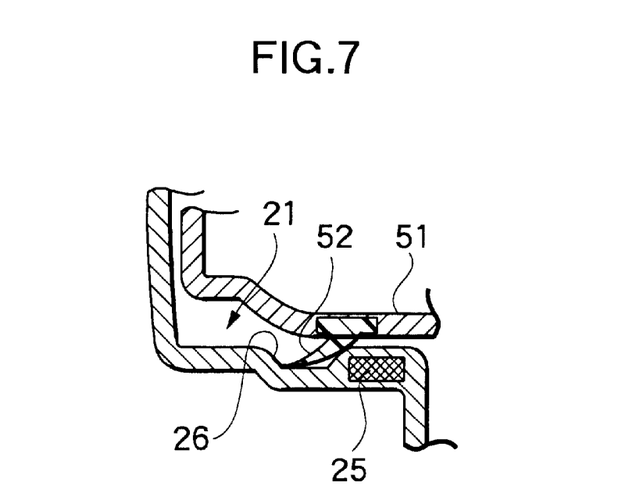
FIG. 7 is main-portion sectional view showing a lid receiving portion of the container body and a third-type lid.

Further, at the lid receiving portion 21, there is formed a sealing groove 26 adapted to receive the sealing member. As shown in FIG. 7, the sealing groove 26 is a recess into which the sealing member 52 of the lid 51 inserts to seal the interior of the container body 2. The bottom surface of the sealing groove is finished as a smooth plain surface to which the sealing member 52 can securely adsorb. At the areas sandwiching the sealing groove 26, such sufficiently broad contacting surfaces are formed so as to be able to accept even the lid which does not have the sealing member 52.

Figure 8:
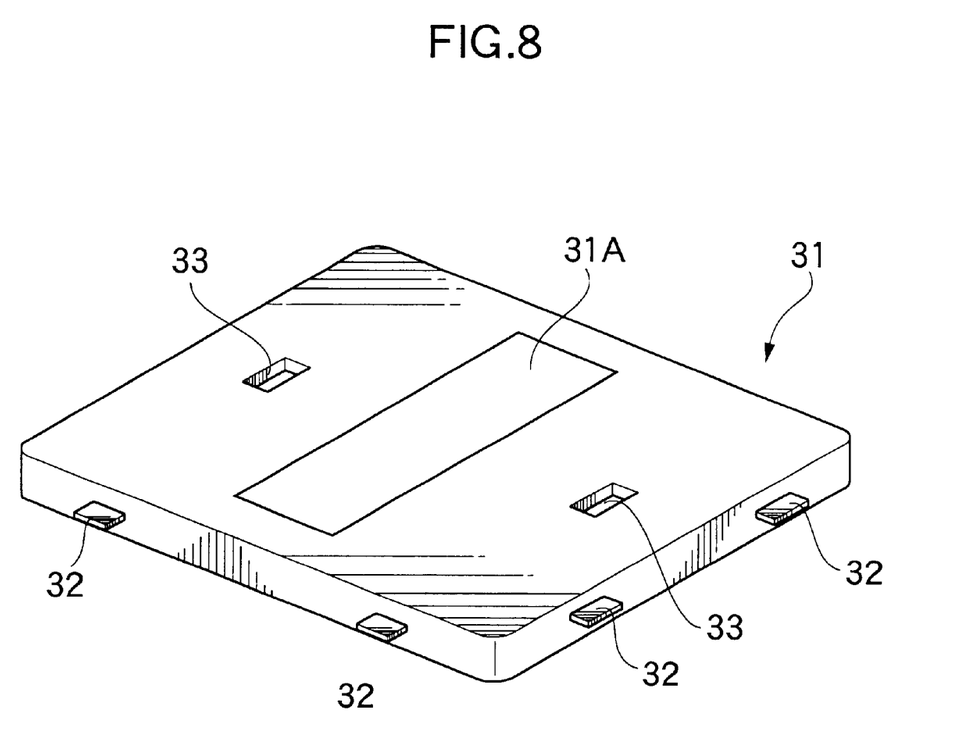
FIG. 8 is a perspective view showing a first-type lid.

There are at least three types of lids: a first-type lid, a second-type lid and a third-type lid. The first-type lid 31 is shown in FIG. 8. The first-type lid 31 is adapted to be secured to the container body 2 by means of the combination of the engagement claw and the engagement hole. The first-type lid 31 is formed as a thick rectangular plate-shaped member. At the center thereof, there is formed a rectangular window portion 31A through which the user can observe the semiconductor silicon wafers accommodated therein. The lower surface of the lid 31 is provided with a wafer pressing unit (not shown) which is adapted to press, from above, the plurality of semiconductor silicon wafers accommodated in the container body 2 so as to stabilize the wafers in the container body 2.

At each of the four corners of the lid 31, there are provided a pair of first engagement claws 32 each of which is adapted to appear and to disappear (i.e. hide or be housed in the lid 31). At the upper surface of the lid 31, there is formed a key hole 33 through which a key is inserted so as to cause the first engagement claws to appear and disappear. When a key is inserted through the key hole 33 and rotated within the key hole 33, the fist engagement claws, which is connected via a link (not shown) to the key hole 33, appear or disappear. The key is provided at the arm of the transfer equipment provided at the production line or the like. Thereby, the lid 31 is automatically attached or detached. It should be noted that the number of the engagement claws 32 provided each corner is two.

Figure 9:
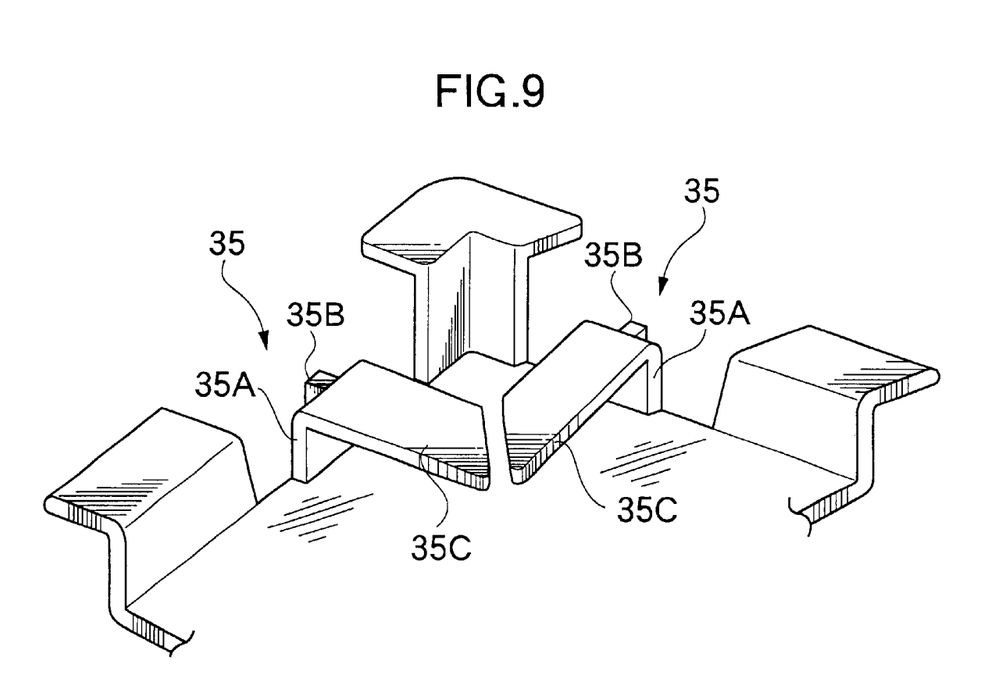
FIG. 9 is a main-portion perspective view showing another example of the first-type lid having an engagement claw of a different constitution.

FIG. 9 shows a second engagement claw 35, which is another example of the engagement claw to be used for the first-type lid. The second engagement claw 35 utilizes elasticity of a synthetic resin. The second engagement claw 35 has elasticity and is constituted by an upright plate portion 35A which is adapted to bend inward, a claw portion 35B provided at the upper portion of the upright plate portion 35A, and a horizontal member 35C which extends from the upper edge of the upright plate 35A inward. The elasticity of the upright plate portion 35A enables the claw portion 35B to engage with the second engagement hole 23. By contrast, when the horizontal portion 35C is pushed downward, the upright portion 35A is bent so that the claw portion 35B is disengaged from the second-engagement-claw engagement hole 23.

Figure 10:
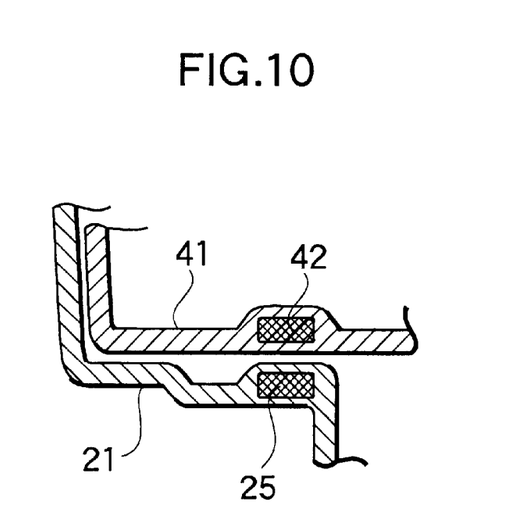
FIG. 10 is a main-portion sectional view showing the lid receiving portion in the container body and a second-type lid.

The second-type lid 41 is shown in FIG. 10.

At the circumferential portion of the lower surface of the second-type lid 41, the magnet 42 is embedded. The magnet 42 may be formed in a continuous manner along the entire circumferential portion of the lower surface of the lid 41, or in a discontinuous manner. Thus, there are various manners in the formation of the embedded magnet 42.

The third-type lid 51 is shown in FIG. 7.

At the circumferential portion of the lower surface of the lid 51, the sealing member 52 is provided along the entire circumferential portion. The sealing member 52 is formed in a rectangular annular shape in conformity with the shape of the lid 51 so as to come into contact with the sealing groove 26 of the container body 2 (which will be described later) so as to seal the container body 2.

The sealing member 52 is formed in such a manner as to extend outward and to taper (i.e. become narrower gradually) towards the lower tip end of the sealing member 52. Owing to this constitution, the sealing member 52 is pressed to the sealing groove 26 by means of an outer pressure caused by the negative pressure in the state that the sealing member 52 is in engagement with the sealing groove 26, whereby secure (i.e. firm and stable) sealing is realized.

[Operation]

The thin-plate accomodating/transporting container having the above-mentioned constitution will be used in the following manner.

Thin plates, such as semiconductor silicon wafers, are accommodated in the container body 2. Thereafter, the transportation-use lid (for example, the lid shown in FIG. 7 or 9) is attached. In the case of the lid shown in FIG. 9, when the lid is pressed downward as it is while the lid is in engagement with the lid receiving portion 21, the upright plate portion 35A is bent so that the claw portion 35B engages with the second-engagement-claw engagement hole 23. In the case of the lid 51 shown in FIG. 7, the lid 51 is attached to the lid receiving portion 21 under the state that the interior of the container body 2 is subjected to vacuum attraction treatment. Thereby, the sealing member 52 is engaged with the sealing groove 26. Also, the sealing member 52 is pressed toward the sealing groove 26 by means of the outer pressure caused by the negative pressure of the interior of the container body, whereby the lid is secured to the container body 2. The container in which the lid is secured to the container body is transported to a semiconductor manufacturing factory or the like while the interior of the container body is being kept clean.

After the container reaches the factory or the like, the transportation-use lid is removed, and instead a lid as used at the production line or the like in the factory (for example, the lid shown in FIG. 8 or 10) is attached. In the case of the lid 31 shown in FIG. 8, the lid 31 is attached to the lid receiving portion 21 in the state that the first engagement claw 32 is housed in the lid 31. Thereafter, the key is inserted into the key hole 33 and rotated so as to cause the first engagement claw to be extended (i.e. appear from the side surface of the lid 31). Thereby, the first engagement claw 32 engages with the first engagement claw engagement hole 22. In the case of the lid shown in FIG. 10, the lid 41 is attached to the lid receiving portion 21 as it is. In this attached state, the magnet 42 of the lid 41 and the magnet 25 in the lid receiving portion 21 approach each other so that the magnets 42 and 41 attract each other. Thereby, the lid is secured to the container body 2. The container in this state is used at production line or the like in the factory.

Since the container body 2 is provided with the standardized positioning engagement portion, the container body can be used for the production line or for storage as it is. At the production line or at the place for storage, the container body 2 is accurately positioned and placed at a predetermined position by means of the positioning engagement portion 18.

Advantages of the Embodiment

As described above, since the container body 2 is so constituted that it can be used not only for transportation but also for the process at the manufacturing steps and for storage, use efficiency is greatly enhanced, waste of resources can be prevented, generation of disposal waste is reduced, and manufacturing costs can be reduced.

Modifications (1) According to the above embodiment, explanation is made by employing the semiconductor silicon wafer as an example of the thin plate to be accommodated in the thin-plate accommodating/transporting container, but the thin plate is not restricted thereto. The thin-plate accomodating/transporting container according to the present invention can be applied to the thin plates which are liable to be adversely affected by gases, fine particles or the like, such as liquid crystal glass plates, and disks used for information storage elements.

(2) In the above-mentioned embodiment, when the second-type lid is employed, magnets are used at both of the lid and the container body. However, among the magnets provided at the lid and the container body, one of the magnets can be replaced by a magnetic member so long as the other remains a magnet.

(3) In the above-mentioned embodiment, as the sealing member receiving portion, the sealing groove 26 constituted as a recess is formed, but the shape of the sealing member receiving portion is not restricted thereto. For example, the sealing member receiving portion may be formed as a flat plane which is finished as a smooth surface to which the sealing member can securely adsorb. Another alternative shape of the sealing member receiving portion is a shape whose cross section has a protrusion. Thus, the shape of the sealing member receiving portion is determined so that the sealing member receiving portion can cope with various types of sealing member.

Advantages of the Invention

As detailed above, the thin-plate accommodating/transporting container exhibits the following advantages.

According to the present invention, the container body of the thin-plate accommodating/transporting container is constructed in such a manner as to cope with various types of lids so that, after the container body is used for transportation, the container body can be used for the process at the manufacturing steps, for storage, or for the other purposes. Owing to this constitution, use efficiency is greatly enhanced.

Further, owing to this construction, it is not necessary to provide separate different containers which are respectively designed for specific uses, such as use in transportation, uses in the factory, and the other uses, so that waste of resources can be prevented.

As a result, the generation of waste disposal can be reduced, so that the manufacturing cost can be greatly reduced.

It should be noted that, since the present invention is not limited to the above-described embodiments and modifications, the scope of the invention is to be determined solely by the appended claims.

What is claimed is:

1. A thin-plate accommodating/transporting container comprising:

a container body for accommodating and supporting a plurality of thin plates while keeping the interior of the container clean, said container having a bottom wall and side walls integrally formed with and extending from said bottom wall to a rim defining a top opening;

plate receiving means, mounted on two of said side walls parallel to and opposing each other, for supporting a plurality of the thin plates therebetween;

positioning means, provided on the container body, for accurately positioning the container body;

a lid receiving portion provided on the container body for attachment of a lid;

engagement means, provided on the lid receiving portion for engaging various types of lids by different attachment methods and including: plural engagement claws or engagement holes which engage with engagement holes or engagement claws provided in a first-type lid; a magnetic member or magnet which attracts a magnet or magnetic member provided in a second-type lid; and a sealing portion which comes into contact with a sealing portion provided in a third-type lid to seal the container by a negative pressure within the interior of the container.

2. The thin-plate accommodating/transporting container of claim 1 further comprising a lid with a sealing surface cooperating with the sealing surface on said container body in a manner whereby the sealing surfaces are pressed together by ambient pressure when the lid is in place on the container body and the interior of the container has a pressure reduced below ambient pressure.

3. The thin-plate accommodating/transporting container of claim 2 wherein one of said sealing surfaces is an elastomeric protrusion and the other of said sealing surfaces is a groove for receiving said protrusion.

4. The thin-plate accommodating/transporting container of claim 1 further comprising the third-type lid, said third-type lid having a sealing surface cooperating with the sealing surface on said container body in a manner whereby the sealing surfaces are pressed together by ambient pressure when the lid is in place on the container body and the interior of the container has a pressure reduced below ambient pressure.

5. The thin-plate accommodating/transporting container of claim 4 wherein one of said sealing surfaces is an elastomeric protrusion and the other of said sealing surfaces is a groove for receiving said protrusion.

6. The thin-plate accommodating/transporting container of claim 5 wherein said protrusion tapers to a point with a side of the tapered protrusion providing one of said sealing surfaces.

7. The thin-plate accommodating/transporting container of claim 3 wherein said protrusion tapers to a point with a side of the tapered protrusion providing one of said sealing surfaces.

* * * * *

UNITED STATES PATENT AND TRADEMARK OFFICE
CERTIFICATE OF CORRECTION

PATENT NO. : 6,491,177 B1
DATED : December 10, 2002
INVENTOR(S) : Yukihiro Hyobu

It is certified that error appears in the above-identified patent and that said Letters Patent is hereby corrected as shown below:

Delete the title page and subsititute therefore the attached title page.

Delete the specification and substitute therefore the attached specification.

Signed and Sealed this

Fourteenth Day of June, 2005

JON W. DUDAS
*Director of the United States Patent and Trademark Office*

(12) United States Patent
Hyobu (10) Patent No.: US 6,491,177 B1
(45) Date of Patent: Dec. 10, 2002

(54) THIN-PLATE ACCOMODATING/ TRANSPORTING CONTAINER

(75) Inventor: Yukihiro Hyobu, Tokyo (JP)

(73) Assignee: Kakizaki Manufacturing Co., Ltd. (JP)

( * ) Notice: Subject to any disclaimer, the term of this patent is extended or adjusted under 35 U.S.C. 154(b) by 0 days.

(21) Appl. No.: 09/536,780

(22) Filed: Mar. 28, 2000

(30) Foreign Application Priority Data

Apr. 6, 1999 (JP) .................................. 11-098420

(51) Int. Cl.⁷ .............................................. B65D 53/00
(52) U.S. Cl. .................... 220/4.01; 220/230; 220/367.1; 206/454; 206/711
(58) Field of Search ............................. 220/4.01, 230, 220/324, 367.1; 206/711, 454, 832

(56) References Cited

U.S. PATENT DOCUMENTS

| | | | | |
|---|---|---|---|---|
| 4,110,552 A | * | 8/1978 | Lombardi | 220/230 X |
| 4,817,799 A | * | 4/1989 | Gregerson et al. | 206/711 X |
| 5,873,468 A | * | 2/1999 | Ejima et al. | 206/454 X |
| 5,944,211 A | * | 8/1999 | Woodnorth et al. | 220/367.1 X |
| 6,170,690 B1 | * | 1/2001 | Hosoi | 206/454 X |

FOREIGN PATENT DOCUMENTS

| | | |
|---|---|---|
| JP | 4728405 | 3/1946 |
| JP | 220042 | 1/1990 |
| JP | 4303941 | 10/1992 |
| JP | 62699 | 1/1994 |
| JP | 7307380 | 11/1995 |
| JP | 964161 | 3/1997 |
| JP | 9107026 | 4/1997 |
| JP | 9139421 | 5/1997 |
| JP | 9301401 | 11/1997 |
| JP | 1056050 | 2/1998 |

* cited by examiner

*Primary Examiner*—Steven Pollard
(74) *Attorney, Agent, or Firm*—Lorusso & Loud (57) ABSTRACT

Disclosed is a thin-plate accommodating/transporting container including a container body for accommodating and supporting a plurality of thin plates while keeping the interior of the container clean, including structure on the container body, for accurately positioning the container body; a lid receiving portion which is provided on the container body and to which the lid is attached; and engagement structure, provided in the lid receiving portion, for engaging with various types of lids of different attachment methods.

7 Claims, 7 Drawing Sheets

THIN-PLATE ACCOMODATING/ TRANSPORTING CONTAINER

BACKGROUND OF THE INVENTION

1. Field of the Invention

The present invention relates to a thin-plate accommodating/transporting container which can be combined with various types of lids, suitable for different uses, such as transportation, processing, storage, and the like.

2. Description of Conventional Art

One commonly known example of a thin-plate accommodating/transporting container is a container which accommodates and transports semiconductor silicon wafers. In such a wafer container, when the container is transported, it is important to keep the interior of the container clean so as to prevent the surfaces of the wafers from becoming contaminated. In order to keep the interior of the container clean, the container is sealed. Sealing of the container is conducted by firmly securing the lid to the container body.

Examples of means for sealing the container include a combination of an engaging claw and an engagement hole, a structure employing a magnet, a structure utilizing a negative pressure (the term "negative pressure" as used herein refers to a pressure lower than the atmospheric pressure.). According to the type of sealing means employed, the container body and lid are provided with a combination of an engaging claw and an engagement hole, a magnet, a sealing member, or the like.

At a wafer manufacturer, semiconductor silicon wafers are placed in the thin-plate accommodating/transporting container, and then the container is sealed by such sealing means. Thereafter, the container is transported to a semiconductor device factory (hereinafter, a container used for transportation will be occasionally referred to as "carriage container".). At this factory, in the vicinity of the production line, the semiconductor wafers are transferred from the carriage container to an IC pattern-forming-step container and/or a storage container i.e., production line container which is placed on the production line. Here, the term "IC pattern-forming-step container" refers to a container used in the process of forming IC (integrated circuit) patterns, and the term "storage container" refers to a container used for storing wafers in the course of the manufacturing steps. The term "production line container" is a generic term inclusive of the IC pattern-forming-step container and the storage container, because the IC pattern-forming-step container and the storage container are both used in the production line.

Each of the above-mentioned types of containers has a function suitable for its use. More particularly, in the case of the carriage container, emphasis is placed on sealing in order to prevent contamination caused by invasion of foreign matters or the like because the carriage container is transported via an automobile or an airplane. In the cases of the IC-pattern-forming-step container and the storage container, emphasis is placed on operability or usability at the time of opening or closing the lid, rather than on sealing, because the IC-pattern-forming-step container and storage container are used in a clean room.

After the semiconductor silicon wafer is transferred from the thin-plate accommodating/transporting container used for transportation (i.e., carriage container) to the production line containers, the thin-plate accommodating/transporting container used for transportation becomes unnecessary and is treated as disposal waste. Thus, conventionally, the thin-plate accommodating/transporting container is used only for transportation. This causes problems of lower use efficiency of the container, waste of resources, increase of disposal waste, and high manufacturing costs.

SUMMARY OF THE INVENTION

In view of the above-mentioned problems, an object of the present invention is to provide a thin-plate accommodating/transporting container which, after being used for transportation, can be also used for the processes conducted at the production line.

To achieve the above object, according to a first aspect of the present invention, there is provided a thin-plate accommodating/transporting container including a container body for accommodating and supporting a plurality of thin plates while keeping the interior of the container clean, comprising:

positioning means, provided on the container body, for accurately positioning the container body;

a lid receiving portion which is provided in the container body and to which the lid is attached; and engagement means, provided at the lid receiving portion, for engaging various types of lids designed for different attachment methods.

Thin plates, such as semiconductor wafers, are accommodated in the container body, and a lid which is used for transportation (hereinafter, occasionally referred to as "transportation-use lid") is attached on the container body, and then the container is transported to a semiconductor manufacturing factory or the like while keeping the interior of the container clean. Thereafter, the transportation-use lid is removed, and a lid used for a production line or the like in the factory is attached to the container body. Attachment of the lid to the container body is by means of engaging means. The container body can be used as is in the production line or for storage in the factory because positioning means provided on the container body is standardized. Placement of the container is conducted in such a manner that the container is accurately positioned at a specific location by means of the positioning means. Thus, the container body can be used for the production line or the like after it is used for transportation. Accordingly, use efficiency is greatly enhanced, and manufacturing costs can be reduced.

According to a second aspect of the present invention, in the thin-plate accommodating/transporting container according to the first aspect of the present invention, the engagement means provided on the container body includes at least two means selected from hooking, adsorption, and vacuum attraction, which serve as means for engaging the lid with the container body.

Thus, a plurality of lids of different attachment methods can be attached to same container body. Accordingly, the container body, which has been used for transporting thin plates, can be used at the production line or the like as it is, so that use efficiency is greatly enhanced, and manufacturing costs can be reduced.

According to a third aspect of the present invention, the engagement means provided on the container body includes: an engagement claw or engagement hole which engages with an engagement hole or engagement claw provided in a first-type lid; a magnetic member or magnet which attracts a magnet or magnetic member provided in a second-type lid; and a sealing member attaching portion or sealing member which comes in contact with a sealing member or sealing member receiving portion provided in a third-type lid to seal the container so as to maintain a vacuum in the interior of the container so that the lid can be pressed inwardly by ambient pressure.

Thus, when the first-type lid provided with the engagement claw or engagement hole is attached to the lid receiving portion formed in the container body, the engagement claw or engagement hole in the first-type lid engages with the engagement claw or engagement hole of the container body, whereby the lid is attached to the container body.

When the second-type lid provided with a magnet or magnetic member is attached to the lid receiving portion, the magnet or magnetic member provided in the second-type lid is attracted to the magnetic member or magnet provided in the container body, whereby the lid is attached to the container body. It should be noted that, in the paired magnet or magnetic member provided in the lid and that magnet or magnetic member provided in the container body, at least one of the elements constituting the pair must be a magnet. This is because, if both elements constituting the pair are magnetic members, they do not attract each other.

When the third-type lid provided with a sealing member or sealing member receiving portion is attached to the lid receiving portion of the container body, the sealing member or sealing member receiving portion provided at the third-type lid comes into contact with the sealing member receiving portion or sealing member provided in the container body, whereby the lid and container body are sealed. The interior of the container body is evacuated so as to give the interior of the container body a negative pressure, whereby the lid is pressed against the container body by the force of the atmospheric pressure.

BRIEF DESCRIPTION OF THE DRAWINGS

Other features, objects and advantages of the present invention will become apparent from the following description of the preferred embodiments with reference to the drawings in which like reference characters designate like or corresponding parts throughout several views, and in which:

FIG. 1 is a perspective view showing a lid receiving portion of a semiconductor silicon wafer accommodating/transporting container according to the present invention;

FIG. 2 is a perspective view showing an entire semiconductor silicon wafer accommodating/transporting container body portion according to the present invention;

FIG. 3 is a sectional view of the semiconductor silicon wafer accommodating/transporting container shown in FIG. 2;

FIG. 4 is an elevational view showing a plate-receiving member used in the semiconductor silicon wafer accommodating/transporting container shown in FIG. 2;

FIG. 5 is a sectional view of the plate-receiving member shown in FIG. 4;

FIG. 6 is an elevational view showing a positioning engagement portion;

FIG. 7 is sectional view showing a lid receiving portion of the container body and a third-type lid;

FIG. 8 is a perspective view showing a first-type lid;

FIG. 9 is a perspective view showing another example of the first-type lid having an engagement claw of a different design; and FIG. 10 is a sectional view showing the lid receiving portion in the container body and a second-type lid.

DETAILED DESCRIPTION OF THE INVENTION

Hereinafter, an embodiment of the present invention will be described with reference to the attached drawings. The following description employs as an example, an embodiment which is a semiconductor silicon wafer accommodating/transporting container which accommodates and transports semiconductor silicon wafers as thin plates.

Referring to FIGS. 2 and 3 a semiconductor silicon wafer accommodating/transporting container 1 is shown as including: a container body 2 for accommodating therein a plurality of semiconductor silicon wafers (not shown); plate-receiving units 4 one of which is provided on each of the opposing side walls of the container body. Each unit 4 has ribs 3 for supporting the semiconductor wafers in the container body 2 from the opposing sides of the wafers in such a manner that the wafers are spaced apart by a predetermined distance; and a lid (See FIGS. 7, 8, 9 and 10) for covering and sealing the open top of the container body 2 so as to keep the interior of the container body 2 clean.

The container body is substantially cubic as a whole. The inside surface of each of the side walls 2A and 2B of the container body 2 is provided with supporting terraces (shoulders) 6, each of which is adapted to support the plate-receiving member 4. Each supporting terrace 6 includes a lower terrace 6A and an upper terrace 6B. Each lower terrace 6A is formed with a lower portion supporting protrusion 7. Each upper terrace 6A is formed with an upper portion supporting protrusion 8.

The plate-receiving unit 4 is detachably mounted on the supporting terrace 6 in the container body 2. The construction of the plate-receiving unit 4 is shown in FIGS. 4 and 5. The plate-receiving unit 4 generally includes: a plurality of ribs 3 which are arranged in parallel at a predetermined spacing and adapted to support the semiconductor wafers in such a manner that the individual wafers are spaced apart from each other; and three parallel supporting bars 12 which are integrally connected to and thereby support the plurality of ribs 3. The bars 12 are arranged at three spaced positions on each rib. A V-shaped groove 13 is formed on the inner surface (surface which contacts with the semiconductor wafers) of the supporting bar 12A, which is the lowermost position of all the supporting bars.

On the rear surface of the plate-receiving unit 4, there are provided three lower portion supporting holes 15 which are engaged by corresponding lower portion supporting protrusions 7 provided on the supporting terraces 6 so as to support the lower portion of the plate-receiving unit 4, and upper portion supporting holes 16 which are engaged by corresponding upper portion supporting protrusions 24 so as to support the upper portion of the plate-receiving unit 4.

As shown in FIG. 2, at one of the end walls of the container body 2, is provided a carrying flange portion 17 which is gripped by the arm of transfer equipment (not shown) provided at a production line or the like. At the other end wall of the container body 2, there is provided a positioning engagement unit 18 (FIG. 6) which serves as positioning means for accurately positioning the container body 2. The positioning engagement unit 18 includes three engaging tips 18A, 18B and 18C. The engagement tips 18A, 18B and 18C have V-shaped engagement groove 19A, 19B and 19C, respectively. The V-shaped grooves 19A, 19B and 19C are arranged extending in three respective directions substantially 120-degree angles. The dimensions, angles and the like of the positioning engagement unit 18 are standardized. At the location where the container body 2 is placed, engagement protrusions (not shown) are provided at three locations corresponding to the engagement tips 18A, 18B and 18C and are adapted to engage with the V-shaped grooves 19A, 19B and 19C, respectively, whereby the container body 2 is accurately positioned.

At each of the side walls, there is provided a handle which is gripped by the operator when the container body 2 is lifted so as to be placed in a vertical position or in a horizontal position. The handle is constructed as a rod-shaped member which extends in an oblique direction. Alternatively, the handle may be constructed as a thick disk-shaped member.

In the upper portion of the container body 2, there is formed a lid receiving portion 21 adapted to receive the lid. The lid receiving portion 21 is formed by broadening the upper edge portion of the container body 2 up to such a dimension as to receive the lid.

At the lid receiving portion 21, there are formed first-engagement-claw engagement holes 22 with which first engagement claws 32 of the first-type lid (which will be described later) engage. At each of the four corners of the lid receiving portion 21, a pair of first-engagement-claw engagement holes 22 are formed. Further, closer to the corner than first-engagement-claw engagement holes 22, there are formed a pair of second-engagement-claw engagement holes 23 (which will be described later) with which the second engagement claws 35 engage.

Further, the lid receiving portion 21 is formed by broadening to such an extent that the lid receiving portion 21 can cope with lids of various shapes. More particularly, the shape and dimensions of the lower circumferential portion of the lid which contacts with the lid receiving portion 21 will differ according to the type of lid. In order to cope with such various shapes and dimensions, it is necessary to make the lid receiving portion 21 sufficiently broad.

At the lid receiving portion 21, a magnet 25 is embedded along the entire circumference of the lid receiving portion 21. Owing to this constitution, the container body can cope with both lids having a magnet embedded in a continuous manner and lids where the magnet is embedded in a discontinuous manner. The magnet 25 may be embedded in such a broader manner as to contain the sealing groove 26 and the areas sandwiching the sealing groove 26. This constitution allows the lid receiving portion 21 to cope with various types of magnets embedded in different manners.

Further, at the lid receiving portion 21, there is formed a sealing groove 26 adapted to receive the sealing member. As shown in FIG. 7, the sealing groove 26 is a recess into which the sealing member 52 of the lid 51 inserts to seal the interior of the container body 2. The bottom surface of the sealing groove is finished as a smooth planar surface to which the sealing member 52 can securely seal. At the areas sandwiching the sealing groove 26, sufficiently broad contacting surfaces are formed so as to be able to accept even a lid which does not have the sealing member 52.

There are at least three types of lids: a first-type lid, a second-type lid and a third-type lid. The first-type lid 31 is shown in FIG. 8. The first-type lid 31 is adapted to be secured to the container body 2 by means of the combination of the engagement claw and the engagement hole. The first-type lid 31 is formed as a thick rectangular plate-receiving member. At the center thereof, there is formed a rectangular window 31A through which the user can observe the semiconductor silicon wafers accommodated therein. The lower surface of the lid 31 is provided with a wafer pressing unit (not shown) which is adapted to press against, from above, the plurality of semiconductor silicon wafers accommodated in the container body 2 so as to stabilize the wafers in the container body 2.

At each of the four corners of the lid 31, there are provided a pair of first engagement claws 32 each of which is adapted to move between the extended position as shown and a hidden position housed in the lid 31. At the upper surface of the lid 31, there are formed key holes 33 through which a key is inserted so as to move the first engagement claws between the two positions. When a key is inserted through the key hole 33 and rotated within the key hole 33, the fist engagement claws, which are connected via a link (not shown) to the key hole 33, may be extended or withdrawn. The key is provided at the arm of the transfer equipment provided at the production line or the like. Thereby, the lid 31 is automatically attached or detached. It should be noted that the number of the engagement claws 32 provided at each corner is two.

FIG. 9 shows a second engagement claw 35, which is another example of the engagement claw to be used for the first-type lid. The second engagement claw 35 utilizes elasticity of a synthetic resin. The second engagement claw 35 has elasticity and is constituted by an upright plate portion 35A which is adapted to bend inward, a claw portion 35B provided at the upper portion of the upright plate portion 35A, and a horizontal member 35C which extends inward from the upper edge of the upright plate 35A. The elasticity of the upright plate portion 35A enables the claw portion 35B to engage with the second engagement hole 23. By contrast, when the horizontal portion 35C is pushed downward, the upright portion 35A is bent so that the claw portion 35B is disengaged from the second-engagement-claw engagement hole 23. The second-type lid 41 is shown in FIG. 10.

At the circumferential portion of the lower surface of the second-type lid 41, the magnet 42 is embedded. The magnet 42 may be formed in a continuous manner along the entire circumferential portion of the lower surface of the lid 41, or in a discontinuous manner.

The third-type lid 51 is shown in FIG. 7.

At the circumferential portion of the lower surface of the lid 51, the sealing member 52 is provided along the entire circumferential portion. The sealing member 52 is formed in a rectangular annular shape in conformity with the shape of the lid 51 so as to come into contact with the sealing groove 26 of the container body 2 (which will be described later) so as to seal the container body 2.

The sealing member 52 is formed in such a manner as to extend outward and to taper (i.e. become narrower gradually) towards the lower tip end of the sealing member 52. Owing to this structure, the sealing member 52 is pressed against the sealing groove 26 by means of ambient pressure due to the negative pressure within, so that the sealing member 52 is in engagement with the sealing groove 26, thereby securing a firm and stable seal.

Operation

The thin-plate accommodating/transporting container having the above-described structure is used in the following manner.

Thin plates, such as semiconductor silicon wafers, are accommodated in the container body 2. Thereafter, the transportation-use lid (for example, the lid shown in FIG. 7 or 9) is attached. In the case of the lid shown in FIG. 9, when the lid is pressed downward as is, while the lid is in engagement with the lid receiving portion 21, the upright plate portion 35A is bent so that the claw portion 35B engages with the second-engagement-claw engagement hole 23. In the case of the lid 51 shown in FIG. 7, the lid 51 is attached to the lid receiving portion 21 and the interior of the container body 2 is evacuated. Thereby, the sealing member 52 is engaged with the sealing groove 26. Also, the sealing member 52 is pressed against the sealing groove 26 by means of the ambient pressure due to the negative pressure within the interior of the container body, whereby the lid is secured to the container body 2. The container with the lid secured to the container body is transported to a semiconductor manufacturing factory or the like while the interior of the container body is kept clean.

After the container reaches the factory or the like, the transportation-use lid is removed, and instead a lid as used at the production line or the like in the factory (for example, the lid shown in FIG. 8 or 10) is attached. In the case of the lid 31 shown in FIG. 8, the lid 31 is attached to the lid receiving portion 21 by the first engagement claw 32 housed in the lid 31. Thereafter, the key is inserted into the key hole 33 and rotated so as to cause the first engagement claw to be extended (i.e. appear from the side surface of the lid 31). Thereby, the first engagement claw 32 engages within the first engagement claw engagement hole 22. In the case of the lid shown in FIG. 10, the lid 41 is attached to the lid receiving portion 21 as it is. In this attached state, the magnet 42 of the lid 41 and the magnet 25 in the lid receiving portion 21 approach each other so that the magnets 42 and 41 attract each other. Thereby, the lid is secured to the container body 2. The container in this state is used at production line or the like in the factory.

Since the container body 2 is provided with the standardized positioning engagement portion, the container body can be used for the production line or for storage as it is. At the production line or at the place for storage, the container body 2 is accurately positioned and placed at a predetermined position by means of the positioning engagement portion 18.

Advantages of the Embodiment

As described above, since the container body 2 is so constituted that it can be used not only for transportation but also at the manufacturing process steps and for storage, use efficiency is greatly enhanced, waste of resources can be prevented, generation of disposal waste is reduced, and manufacturing costs can be reduced.

Modifications (1) According to the above description, a semiconductor silicon wafer is employed as an example of the thin plate to be accommodated in the thin-plate accommodating/transporting container, but the thin plate is not restricted thereto. The thin-plate accommodating/transporting container according to the present invention can be used for thin plates which are liable to be adversely affected by gases, fine particles or the like, such as liquid crystal glass plates, and disks used for information storage elements.

(2) In the above-described embodiment, when the second-type lid is employed, magnets are used at both of the lid and the container body. However, one of the magnets can be replaced by a magnetic member so long as the other remains a magnet.

(3) In the above-described embodiment, the sealing member receiving portion is the sealing groove 26 formed as a recess, but the shape of the sealing member receiving portion is not restricted thereto. For example, the sealing member receiving portion may be formed as a flat plane which is finished as a smooth surface to which the sealing member can securely seal. Another alternative shape of the sealing member receiving portion is a shape whose cross section has a protrusion. Thus, the shape of the sealing member receiving portion is determined so that the sealing member receiving portion can cope with various types of sealing members.

Advantages of the Invention

As detailed above, the thin-plate accommodating/transporting container exhibits the following advantages.

According to the present invention, the container body of the thin-plate accommodating/transporting container is constructed in such a manner as to cope with various types of lids so that, after the container body is used for transportation, the container body can be used for the manufacturing process steps, for storage, or for other purposes. Owing to this feature, use efficiency is greatly enhanced.

Further, by the present invention, it is not necessary to provide separate different containers which are respectively designed for specific uses, such as use in transportation, uses in the factory, and the other uses, so that waste of resources can be prevented.

As a result, the generation of waste to be disposed is reduced, so that the manufacturing cost can be greatly reduced.

It should be noted that, since the present invention is not limited to the above-described embodiments and modifications, the scope of the invention is to be determined solely by the appended claims.

What is claimed is:

1. A thin-plate accommodating/transporting container comprising:

a container body for accommodating and supporting a plurality of thin plates while keeping the interior of the container clean, said container having a bottom wall and side walls integrally formed with and extending from said bottom wall to a rim defining a top opening;

plate receiving means, mounted on two of said side walls parallel to and opposing each other, for supporting a plurality of the thin plates therebetween;

positioning means, provided on the container body, for accurately positioning the container body;

a lid receiving portion provided on the container body for attachment of a lid;

engagement means, provided on the lid receiving portion for engaging various types of lids by different attachment methods and including: plural engagement claws or engagement holes which engage with engagement holes or engagement claws provided in a first-type lid; a magnetic member or magnet which attracts a magnet or magnetic member provided in a second-type lid; and a sealing portion which comes into contact with a sealing portion provided in a third-type lid to seal the container by a negative pressure within the interior of the container.

2. The thin-plate accommodating/transporting container of claim 1 further comprising a lid with a sealing surface cooperating with the sealing surface on said container body in a manner whereby the sealing surfaces are pressed together by ambient pressure when the lid is in place on the container body and the interior of the container has a pressure reduced below ambient pressure.

3. The thin-plate accommodating/transporting container of claim 2 wherein one of said sealing surfaces is an elastomeric protrusion and the other of said sealing surfaces is a groove for receiving said protrusion.

4. The thin-plate accommodating/transporting container of claim 1 further comprising the third-type lid, said third-type lid having a sealing surface cooperating with the sealing surface on said container body in a manner whereby the sealing surfaces are pressed together by ambient pressure when the lid is in place on the container body and the interior of the container has a pressure reduced below ambient pressure.

5. The thin-plate accommodating/transporting container of claim 4 wherein one of said sealing surfaces is an elastomeric protrusion and the other of said sealing surfaces is a groove for receiving said protrusion.

6. The thin-plate accommodating/transporting container of claim 5 wherein said protrusion tapers to a point with a side of the tapered protrusion providing one of said sealing surfaces.

7. The thin-plate accommodating/transporting container of claim 3 wherein said protrusion tapers to a point with a side of the tapered protrusion providing one of said sealing surfaces.

* * * * *